United States Patent [19]

Granville et al.

[11] Patent Number: 5,006,846
[45] Date of Patent: Apr. 9, 1991

[54] POWER TRANSMISSION LINE MONITORING SYSTEM

[76] Inventors: J. Michael Granville, 9701 Wilshire Blvd., #850, Beverly Hills, Calif. 90212; Robert E. Costa, 8435 Sale Ave.; Sam Y. Chu, 23684 Justice St., both of Canoga Park, Calif. 91304

[21] Appl. No.: 464,707

[22] Filed: Jan. 12, 1990

Related U.S. Application Data

[63] Continuation of Ser. No. 119,750, Nov. 12, 1987, abandoned.

[51] Int. Cl.$^5$ .............................................. H04B 9/00
[52] U.S. Cl. ........................... 340/870.28; 340/870.17; 340/870.29; 324/126
[58] Field of Search ................. 340/870.28, 870.17, 340/870.29, 310 R, 538, 658, 657, 660, 664; 324/126, 127, 142, 117 R; 364/481, 483, 492; 323/357; 361/93, 91

[56] References Cited

U.S. PATENT DOCUMENTS

| | | | |
|---|---|---|---|
| 3,506,833 | 4/1970 | Willisen | 340/870.29 |
| 3,629,703 | 12/1971 | Bernard | 340/870.29 |
| 3,991,367 | 11/1976 | Chapman et al. | 340/870.29 |
| 4,158,810 | 6/1979 | Leskovar | 340/870.17 |
| 4,471,355 | 9/1984 | Hardy et al. | 340/870.29 |
| 4,578,639 | 3/1986 | Miller | 324/142 |
| 4,709,339 | 11/1987 | Fernandes | 340/870.17 |
| 4,758,962 | 7/1988 | Fernandes | 340/870.17 |

OTHER PUBLICATIONS

Moulton, "Light Pulse System Shrinks High-Voltage Protection Device", Industrial Electronics, 5-17-65, pp. 71-75.

Primary Examiner—Donald J. Yusko
Assistant Examiner—Edwin C. Holloway, III

[57] ABSTRACT

Electric power line phase conductor (line) monitoring system in which a single measuring station can measure all the power parameters of voltage and current and phase angle plus ambient and line temperatures. The measuring station fastens to the line, typically draws power from the line, is small, light, and manually installed without the need for a line power outage. The measured data is transmitted from the measuring station up on the power line phase conductor to a ground receiving and data processing station by either radio or a fiber optic cable or an optical-through-air data link. Each type of data link, fiber optic, radio or optical-through-air, can be built to carry either analog (linear) or digital data. Line true RMS voltage and true RMS current values, line phase angle, along with ambient and line temperature values are digitized and transmitted in digital form through a digital data link. Real time analog voltage and current sinusoidal waveforms are transmitted in analog form through a linear data link with only group delay which for a 50-foot long fiber optic cable would be roughly only 50 nanoseconds. Voltage data is obtained by an elegantly simple voltage divider technique which takes advantage of the highly dielectric character of plastic and glass materials in general and fiber optic cables in particular to form a dual purpose unibody cable assembly containing both the optical fibers of the data link and the large resistance resistive link of the voltage divider. Resistive link materials are described which have high precision resistance tolerance and low temperature coefficients of resistance, and thus improve the accuracy of the voltage sensor by establishing precisely the total resistance of the resistive link and by minimizing changes in the magnitude of that resistance due to changes in ambient temperature.

21 Claims, 3 Drawing Sheets

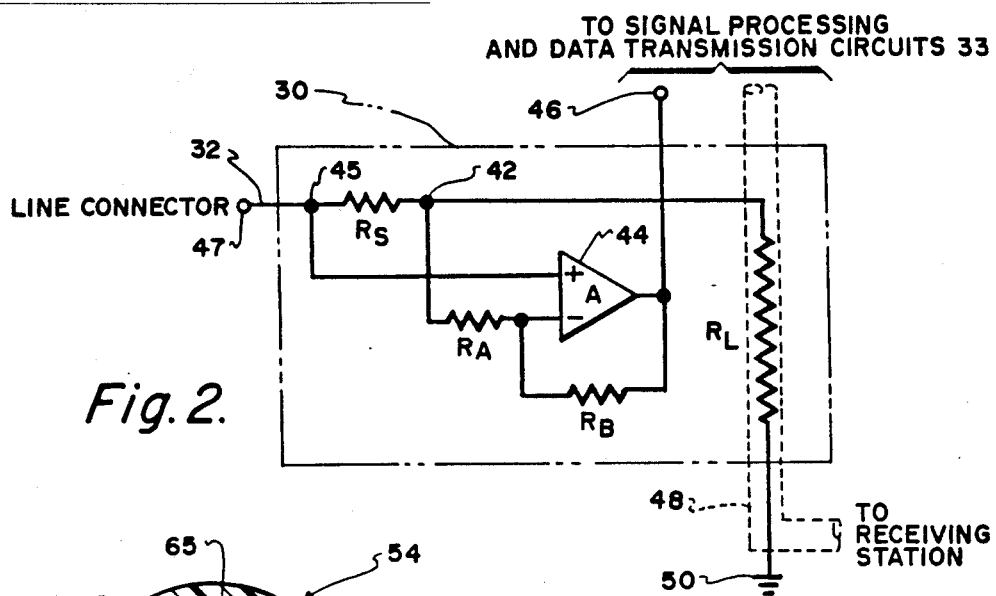
Fig. 2.
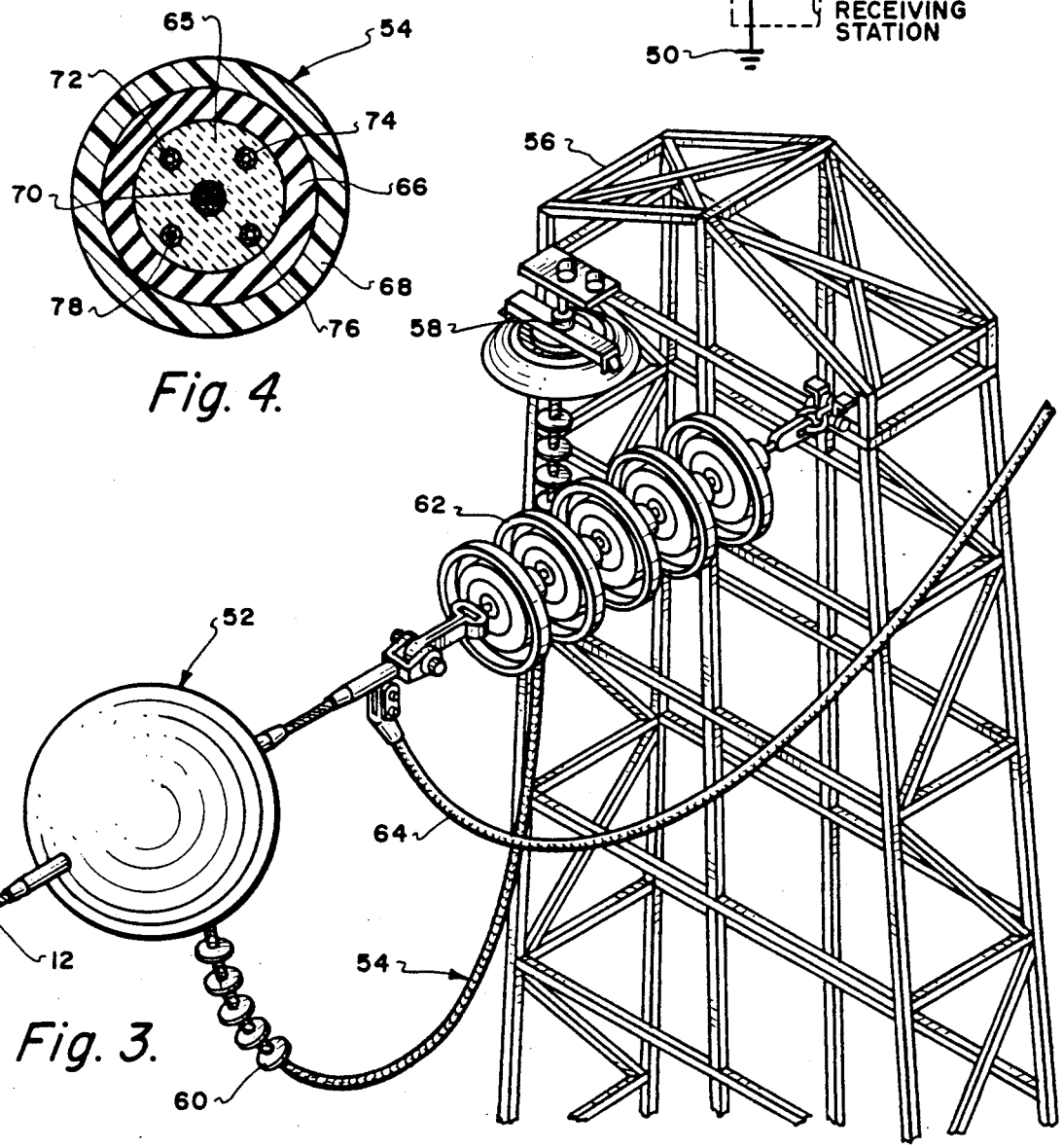
Fig. 4.
Fig. 3.

POWER TRANSMISSION LINE MONITORING SYSTEM

This is a continuation of co-pending application Ser. No. 07/119,750 filed on Nov. 12, 1987, now abandoned.

FIELD OF THE INVENTION

This invention relates to power transmission line monitoring systems and more particularly relates to a power transmission line power monitoring system using a unique voltage divider technique for monitoring voltage, in addition to the monitoring of the other power parameters of current, and of the phase angle between the current and the voltage, plus the line and the ambient temperatures.

BACKGROUND OF THE INVENTION

Power line transmissions are extremely difficult to monitor accurately because of the high voltages and currents flowing through the lines. Heretofore massive costly structures were needed to connect high voltage lines to ground to obtain accurate voltage measurements. These devices employ potential transformers (PT's) or coupling capacitor voltage transformers (CCVT's), which only measure voltage, mounted on a massive insulated standoff supported by a ground base. Just one of these systems can cost as much as $20,000 or more in 1986 dollars for a single two hundred kilovolt phase conductor.

Voltage in many power transmission lines is measured with a PT or CCVT while current measurement heretofore has required the use of a separate device, typically a current transformer (CT). Voltage and current transformers are used for revenue metering when accuracy better than 0.3% is desirable and for protective relaying where fast circuitry response and interference free data transmission are desirable. These PT/CCVT and CT transformers are massive in design and structure because they must be in direct contact with the high voltage line on the primary side, and with earth or ground potential on the secondary side where the voltage current measurement is made. The ground side of the PT and CT transformers typically uses ohms per centimeter to physically bridge the voltage gradient. These porcelain high resistance bushings in order to have sufficient insulation to bridge power company line to ground voltage gradients of up to roughly 500 kilovolts (KV) are tall, about 20 feet, and thus are concomittantly massive and costly. In addition, the accuracy of these devices is limited and not typically within the 0.3% desired.

Additional problems with recording the data from a PT/CCVT are that cables leading from these devices to metering or relaying equipment located elsewhere can sometimes pick up high frequency noise which can interfere with optimal operation of relay, control and metering equipment. These effects further increase costs and also reduce the efficiency of the systems.

Another disadvantage is the high cost of installing these transformers, and maintenance operations on them, which require costly high voltage power line outage time since the power transmission line must be disconnected from use while installation or maintenance proceeds. These transformers are also used to derive the phase angle of the power by processing the output of a PT transformer and separately a CT transformer, at separate processing equipment located some distance from the PT and CT. With such two linear outposts delivering data from two different and independent transformers being transmitted over a distance into a third processing station, accuracy of course is limited and the costs can be significant.

Another method of measuring transmission line voltage is by use of an electrostatic voltmeter, also called a capacitive voltmeter which is a non-contact instrument for measuring electric field strength. While these devices can be used to measure high voltages, such as 5-120 KV (kilovolts), they have never been widely accepted for use by the power industry due to the lack of accuracy and stability and the need to convert electric field strength to voltage.

Of two other devices for monitoring certain parameters of power transmission lines, one is in the shape of a toroid, and a second is in the shape of a shoebox. Both are freely mounted on and in contact with a transmission line. The toroid has circuitry which measures voltages and phase angle and both devices measure current and conductor surface and ambient temperature and transmit the information to a remote ground station via a radio data link. These systems are line powered and self-contained modules. Line temperature and line current are needed to calculate the dynamic thermal line rating. The sensing device mounted in the housing on the transmission line includes a radio frequency (RF) transmitter transmitting measured information to a ground station where it is then processed. The shoebox device is not without problems since it does not measure voltage and thus, cannot measure phase angle. The toroidal device is also not without problems because the voltage sensor employing an electrostatic voltmeter, rather than a more accurate PT or CCVT, has accuracy typically of only about plus or minus 5% at best. Such accuracy is typically not adequate for most power company revenue metering and protection and load management or networking purposes.

An additional problem with these systems is the use of radio frequency data links as the sole means to transmit data from the power line down to ground station receivers which use radio frequencies requiring a Federal Communications Commission (FCC) license. Obtaining such a license can be difficult for power companies operating in urban areas already crowded with radio transmissions which may need, for example, twenty or more transmitters, and thus twenty or more licenses. Of the two transmission line "hot-stick" mounted toroidal or "shoebox" housed systems on the market, one offers only a radio link at 450 megahertz (MHz) and the other offers only a radio link at 926 MHz, both frequencies of which require a separate FCC license; no other data links, such as optical-through-air or fiber optic are offered in either system.

Though known available transformer systems provide accurate voltage measurement for metering or protective relaying, these existing state of the art PT and CT transformers are large and massive and thus expensive to buy, ship and install. Additionally, during installation or repair, they also require a line outage in which all adjacent equipment and the transmission lines they are to be connected to must be shut down. Installation further requires the use of an overhead crane to lift the heavy transformers and many skilled tradesmen to prepare structural concrete mounting pads and other equipment. Thus these PT and CT devices are extremely expensive to install on transmission lines. These systems are reliable over long periods in that they can last as much as forty years or so; however, their accuracy will drift over years of field use and there is no economically and technically feasible way to recalibrate them in the field. If a power company is metering $100,000,000 of power delivered on a line to a customer, and the metering system drifts off by one percent (1%) or more over a long period of field use, the errors can be in megadollars.

It is therefore, the object of the present invention to provide a power line monitoring system which is accurate, reliable and stable for installation and long term use on power transmission lines to monitor and measure line voltage, line current, line temperature, ambient temperature and phase angle. Phase angle is the angle in degrees between comparable points of the voltage and current waveforms. One degree is 1/360 of a single full alternating current (AC) cycle. Typically the time between, for example, the zero crossing of the negative going voltage sinusoid and the zero crossing of the negative going current sinusoid is measured. That time period is converted to degrees of phase angle phi ($\phi$). The value (cosine $\phi$) is the power factor. Power (P) equals the product of current (I) voltage (V) and power factor (cos $\phi$) with current and voltage expressed in true RMS units. Thus:

$$P = IV \cos \phi$$

For $\phi = 0$ degrees, cos $\phi = 1$, and there are no reactive losses. If the current leads the voltage by 10 degrees, the power factor cos $\phi = \cos (10°) = 0.985$ and the load is capacitive. If the current lags the voltage by 10 degrees, the power factor cos $\phi = \cos (10°) = 0.985$ and the load is inductive.

It is yet another object of the present invention to provide a power line monitoring system which is compact and inexpensive enough to be easily mounted on transmission lines without interrupting line use.

Yet another object of the present invention is to be a power line monitoring system using an elegantly simple voltage divider technique to provide accurate independent metering of voltage.

Yet another object of the present invention is to provide a power line monitoring system which measures line voltage, line current, line phase angle, and line and ambient temperatures using electronic sensors in contact with the high voltage transmission lines.

Still another object of the present invention is to provide a power line transmission monitoring system with a measuring station mounted directly on the power line, directly communicating with a ground receiving and data processing station located nearby.

Still another object of the present invention is to provide a power transmission line monitoring system having a measuring station connected to the ground by a fiber optic cable transmitting linear (analog) and/or digital voltage, current, phase angle and temperature measurement data. The phase angle is derived from the voltage and current waveform data.

Yet another object of the present invention is to provide a power transmission line monitoring system using a simple voltage divider having a very large ohmic resistance incorporated into a fiber optic cable link forming a unitized resistive link/fiber optic cable assembly. Thus, the fiber optic cable assembly serves as both a data link to transmit data from the line to the ground, and also as a means of containing the voltage sensor voltage divider large ohmic resistance resistive link, which resistive link has a fixed connection to the line at line potential at one end and a fixed connection to the ground at ground potential at the other end across the voltage gradient.

Another object of the invention is to avoid the severe costs and operating complexities attendant with the massive high voltage to ground bridge structures of potential transformers and current transformers.

Yet another object of the present invention is to avoid the costs and operating complexities of present systems by measuring line voltage, current, phase angle, temperature and ambient temperature using electronic sensors employing components which are inexpensive and can be located within a single monitoring system measuring station located on and in contact with high voltage transmission lines.

Still another object of the present invention is to provide a live-line (no line outage) installation of a transmission line monitoring system which can easily be installed or removed using electric power industry manual "hot-stick" apparatus without interrupting the power line.

Still another object of the present invention is to provide a power line monitoring system which will eliminate the requirement for a dedicated potential transformer to measure current. This is accomplished by measuring line voltage, current, phase angle, temperature, and ambient temperature from a single solitary measuring station.

Still another object of the present invention is to process and transmit real time analog line voltage and current waveform data (and in some cases perhaps temperature data) to the ground using linear fiber optic or radio or optical-through-air transmitters and receivers with only group delay of typically only 20–50 nanoseconds in order to minimize delay time for purposes of fast system protection relaying and circuit breaking where the goal is to detect voltage and/or current faults as quickly as possible which means in some cases in less than 1 AC cycle of 16.7 milleseconds (ms).

Yet another object of the present invention is to provide a transmission line monitoring system which can transmit data to ground based receiving stations through a dual purpose cable incorporating a resistive link filament and optical fiber data links.

Yet another object of the present invention is to provide a power line transmission monitoring system which can digitize raw analog voltage, current, phase angle and line and ambient temperature data, either before or after data transmission from the power line measuring station to the ground based receiving and data processing station. Digital circuitry incorporated in the monitoring system may be dedicated to processing one parameter or may be shared by two or more parameters using multiplexing means depending upon how often parameter data is taken, digitized and transmitted. With multiplexing one data link can time-sequentially transmit multiple data parameters. Typically the data is digitized up in the power line measuring station. Typically the data digitized is true RMS line voltage, true RMS line current, phase angle, line and ambient temperature for purposes of metering and networking/load management.

Still another object of the present invention is to provide a transmission line monitoring system having a duplexing fiber optic cable link which allows simultaneous two-way flow of data, to and from the ground. Thus, a command and control computer on the ground can be connected to the fiber optic cable assembly to send and receive diagnostic and calibration data to and from the monitoring system measuring station connected to the high voltage power line phase conductor.

Yet another object of the present invention is to provide a transmission line monitoring system providing accurate measurement of voltage using a voltage divider technique and enhancing the accuracy of the voltage sensor by providing circuitry to correct for the effect of changes in the resistance of ohms of the voltage divider as a function of changes in ambient temperature and/or by employing a resistive link whose resistance has a very high tolerance and a very low temperature coefficient of resistance (TCR). In describing a resistor with, for example, a 0.1% or 0.01% tolerance, the words very high tolerance or precision tolerance or very close tolerance are all synonymous.

BRIEF DESCRIPTION OF THE INVENTION

The purpose of the present invention is to provide a power transmission line monitoring system which can measure line voltage, line current, line temperature and ambient temperature, determine the phase angle between the voltage and the current sinusoidal waveforms, and which has the option of either fiber optic or radio or optical-through-air transmission of data from the power line measuring station to the ground receiving and data processing station.

The system of the present invention uses a current transformer to inductively draw electromagnetic energy from the line. The transmission line forms the one-turn primary of the transformer and if, for example, the multi-turn secondary has 1000 turns, then the transmission line current is exactly transformed or reduced by a factor of 1000. This current output from the secondary windings of the current transformer is then rectified and fed to a power supply. A line current sensing circuit whose sense resistor lies in the system return, senses the transformed line current. Also included in the design are temperature sensing transducers mounted in contact with the transmission line phase conductor and in contact with the ambient air to sense the line temperature and the ambient temperature which data are then fed to a temperature sensing amplifier circuit for processing. The entire monitoring system is mounted within a housing pod which can be fastened to power transmission line phase conductors using a standard device known as a "hot-stick" which enables a rotary wrenching mechanical action to tighten or clamp the housing securely in compression onto the phase conductor.

The measuring station circuitry system return is referenced to and attached to the transmission line. Thus, an observer located within the frame of reference of the measuring station up on the overhead transmission line observes the earth's potential changing sinusoidally at 60 Hz and equal in magnitude and having reversed polarity (positive or negative potential) as that line potential observed by an observer on the earth. Additionally, line voltage is sensed by a unique voltage divider technique having a small, precision sensing resistor connected to the measuring station return in series with a very large ohmic value load resistance resistor which forms a physical bridge connection to earth ground. Voltage sampling at the junction of the two resistors provides accurate voltage measurement for input to signal processing circuits.

The large load resistance is a resistive link of a long resistance element, typically of a filamentary shape, or of multiple individual discrete resistor elements in series, connected between the measuring station housing pod and earth ground at which there is a secure mechanical connection. The earth ground electrical terminus and the physical terminus of the earth end of the resistive link can be made at a location up in the transmission line tower or down on the ground.

The load resistance can be a long flexible line of high precision tolerance, low temperature coefficient of resistance (TCR), high resistance discrete resistor elements in an assembly forming a long flexible resistive link filamentary element hanging from the measuring station housing pod at one end, and connected to the transmission tower or other ground terminus at the other end. Optionally, the large load resistance can be a long resistive element housed within a fiber optic cable containing optical fibers for transmitting collected data from the monitoring system measuring station to the ground receiving and data processing station. In this manner the large load resistance with the fiber optics incorporated into a single cable assembly accomplishes two tasks: the provision of a data link from the monitoring system measuring station to the ground receiving station simultaneously with the function of containing the voltage sensor voltage divider large ohmic load resistance resistive link. The resistive link has a fixed connection to the line at line potential at one end and a fixed connection to the ground at ground potential at the other end across the voltage gradient; that arrangement of fixed end points satisfies the physics of measuring voltage since voltage, a scalar quantity in physics, is defined as the line integral of the vector electric field over a length vector between two points in space with the value of the integral not being dependent on the path between the two points but only dependent on the spatial position of the two points.

Line current, voltage, phase angle, temperature and ambient temperature sensing circuits provide outputs to a signal processing and data transmission circuit. The signal processing and data transmission circuit provides an electronic processing passage which includes an analog to digital converter and optical modulator and a multiplexer for converting the current, voltage, phase angle and temperature circuit outputs to proper form for serial transmission in digital multi-bit word packets to a ground based receiving station. Additionally, analog data such as the AC voltage and current waveforms can be transmitted directly to the ground using linear-/analog processing circuitry including linear fiber optic or radio transmitters and receivers.

The current transformer and system return are incorporated into a housing which can be clamped on a transmission line without interrupting power. A rotary wrenching action or linear pulling action or other action of the "hot-stick" can rotate an acme screw or snap a jaw closed or activate another type of mechanism to close the housing around the line and also close the current transformer around the line and clamp the system return and the line temperature sensor to the line. The large resistance of the voltage divider circuit being connected to the power line tower, or other ground location, now provides accurate voltage measurement. The monitoring system will accurately measure the line voltage, current, phase angle, temperature, and ambient temperature; and thus, the ground receiving and data processing station can supply the data needed to make comparisons between two or three phase conductors on a single power line or between two or more power lines in an electric power transmission and distribution grid. The system can provide information for purposes of revenue metering, fault detection/protective relaying, load/energy management, networking, data acquisition including waveform data, automation and supervisory control. A typical monitoring system is attached directly to each power line phase conductor without interrupting operation and takes data measurements which are processed and sent over a data link to a ground based receiving station at ground potential.

The above and other novel features and advantages of this invention will be more fully understood from the following detailed description and the accompanying drawings:

BRIEF DESCRIPTION OF THE DRAWINGS

FIG. 2 is a diagram semi-schematic form illustrating the unique voltage sensing circuitry of the system.

FIG. 3 is a diagram illustrating the installation of a power line transmission monitoring system on an existing power line phase conductor.

FIG. 4 is a cross-sectional view of a cable incorporating a large resistance and optical fibers.

DETAILED DESCRIPTION OF THE INVENTION

Figure 1:
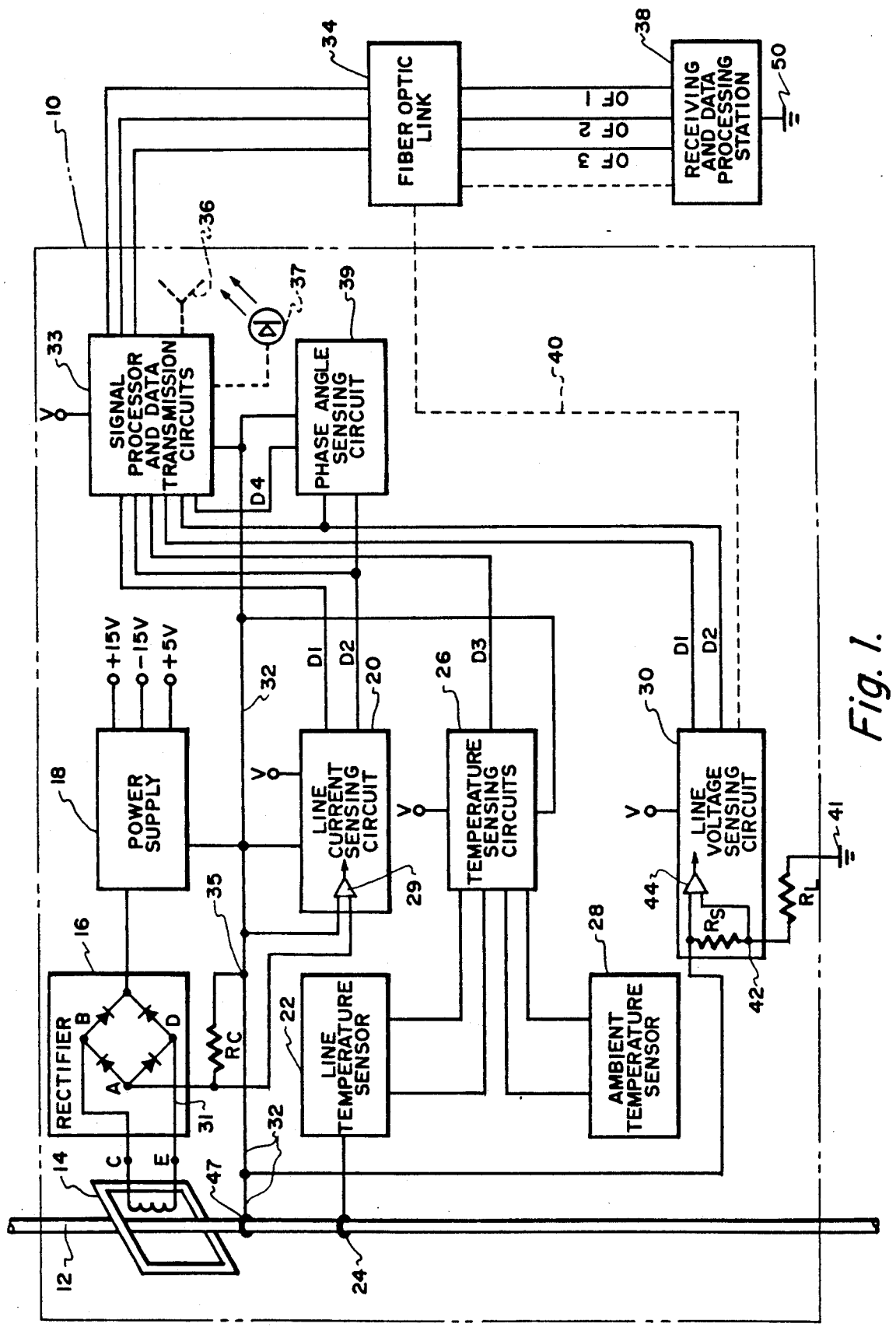
FIG. 1 is a block diagram illustrating the power transmission line monitoring system.

The system described is a power line monitoring system for measuring conductor line voltage, current, phase angle, temperature, and ambient temperature. The system can be used for power transmission and distribution applications including revenue metering, system protection/fault detection/protective relaying, load/energy management, networking, data acquisition including waveform data, automation and supervisory control. The monitoring system is attached directly to each high voltage power transmission phase conductor line to take the data measurements which then are sent through a fiber optic data link to a ground based receiving station for processing. Optionally the data can be transmitted via radio transmissions to a ground receiving station when the monitoring system measuring station is in a remote location or a location where ground electric power is not available. Alternatively, an optical-through-air data link could be used. In that case a light emitting diode (LED) or laser transmitter would be placed at 37 in FIG. 1 and aimed at the ground receiving station in alignment with a receiving lens or other suitable optical means aligned to refract, focus, absorb, and detect the received light beam.

The monitoring system in the block diagram of FIG. 1 has voltage, current, phase angle, and temperature sensing devices mounted in measuring station housing pod 10 which will be described in greater detail hereinafter. Current and power from a current transformer 14 fully encircling transmission line phase conductor 12 is fed to rectifier 16 which provides outputs to power supply 18 and line current sensing circuit 20. A line temperature sensing device 22 is clamped at 24 around transmission line 12 providing line temperature readings to temperature sensing amplifier circuits 26. The temperature sensing circuit amplifier circuit 26 also receives an input from an ambient temperature sensing device 28 which is in contact with the ambient air surrounding the measuring station housing pod 10 in such a way that the sensing device and the air around it is "in the shade", that is, not directly exposed to the radiant heating effects of direct sunlight radiation and also not directly exposed to the heat from the power line since transmission lines can operate up to 100 degrees Centigrade. The output of the phase angle sensing circuit 39 is shown as data path D4 which is typically a digital data output to signal processor and data transmission circuits 33. The output of temperature sensing amplifier circuits 26 is shown as data path D3 which is an analog data output to the signal processor and data transmission circuits 33. Within 33 the data is digitally modulated and transmitted by a digital data link which data link can be fiber optic, radio, or optical-through-air.

The measuring station system also includes line voltage sensing circuit 30 which is a voltage divider connected between the measuring station circuitry return line 32 directly connected to the transmission line 12 at 47 at one end, and earth ground 41 at the other end.

The two outputs of voltage sensing circuit 30 and of the line current sensing circuit 20 are shown as data paths D1 and D2. D1 is real time waveform analog data output from voltage sensing circuit buffer amplifier 44, and from current sensing circuit buffer amplifier 29, to the signal processor and data transmission circuits 33 for analog modulation and transmission by a linear (analog) data link, which data link can be fiber optic 34, radio 36, or optical-through-air 37. D2 is a true RMS analog data output from voltage sensing circuit buffer amplifier 44 or other buffer means, and from current sensing circuit buffer amplifier 29 or other buffer means, to the signal processor and data transmission circuits 33 for digital modulation and transmission by a digital data link which data link can be fiber optic, radio, or optical-through-air.

Besides processing linear voltage and current real time alternating current (AC) waveform data, the signal processor includes analog to digital converters and a multiplexer for digitally modulating and transmitting line true RMS voltage, true RMS current, phase angle, temperature, and ambient temperature data. Either a fiber optic data link 34 or RF transmissions from antenna 36, or optical transmissions from an LED or laser 37 transmit the data to the ground receiving and data processing station 38.

The entire measuring station circuitry uses transmission line 12 as its reference potential and system return. System return 32 is connected to the line at 47 thereby providing a unique frame of reference for the measuring station circuitry. There is no current between points 35 and 47; points 35 and 47 are at the same potential. Since the current flows into point 35 from the system return 32, the current according to convention is negative. The current at point 35 is full wave rectified and travels through current sensing circuit resistor $R_c$ to the rectifier at point A. For one-half of each AC cycle the current at A travels from A to B to C; during the other half cycle, the current at A travels from A to D to E. This method allows the system to take advantage of standard signal processing components by using the power line as the return and a frame of reference.

The use of a fiber optic data link 34, the RF data link 36, or the optical data link 37 allows the system to monitor the line and allows the measured parameters to be referred to line potential, thus allowing the use of circuitry components which effectively do not "see" the high voltage on the line.

Preferably power supply 18 is an overload protected circuit with a battery backup and includes a DC to DC converter providing outputs, for example, of +15 volts, −15 volts, and of +5 volts for operating solid state circuits. When the monitoring system is located on a direct current (DC) high voltage transmission line, power may be supplied by battery, fuel cell or solar cell devices. When the monitoring system is mounted on an AC high voltage transmission line typically a current transformer 14 can be used to inductively draw power from the conductor to power the system. However, on a DC transmission line, a current transformer will not work since the magnetic field from the DC line does not vary with time.

Thus, the monitoring system measuring station power source is different for AC and DC power lines. Also, phase angle measurement and power factor calculation as described herein are applicable to AC and not to DC power lines. However, for both AC and DC power lines the voltage and temperature sensors, data links and other system components are the same, except that the current sensing circuit for AC lines is as described herein, whereas the current sensing circuit for DC lines would be different in that it might employ the well known. Hall effect current sensing means.

The monitoring system power supply 18 provides isolated, rectified regulated power at the desired DC voltages and currents to the other circuits of the measuring system.

Line voltage sensing circuit 30 uses a voltage divider concept connected to the system return line 32 providing a derived voltage measurement output to signal processor and data transmission circuits 33. Line voltage sensing circuit 30 has a resistive link physical bridge connected at one end to system return line 32 with the other end connected to earth ground 41. The voltage divider is comprised of one or more, but typically one, small precision resistance $R_s$ connected to the return line 32 at one end in series with a large resistance $R_L$. $R_L$ is connected to $R_s$ at one end and to a ground based earth ground potential terminus 41 at the other end. This terminus is shown in FIG. 1 as 41 for the case where the resistive link cable assembly forms its own bridge to ground, and as 50 in FIG. 1 for the case where the resistive link is a component of a fiber optic cable assembly 34. The mechanical link between line voltage sensing circuit 30 and the fiber optic data transmission link 34 is indicated by dotted line 40 which will be described in greater detail hereinafter.

Power line 12 current is measured by transforming the current down by a known ratio via current transformer 14. The power line phase conductor serves as the one turn primary winding of the current transformer. Typically, for example, for a 230 KV (line to line potential) power line, if there are 1000 turns in the secondary winding, then the ratio is 1:1000. Thus, if the line is carrying 500 Amperes, the output of the transformer will be 0.5 Amperes. The output of the current transformer 14 is fed to rectifier 16. The transformer current is then determined by direct measurement of the voltage drop across the known precision resistance $R_C$. The current reaching point 35 is negative full wave rectified and flows across $R_C$ to the rectifier at point A. Line current sensing circuit 20 measures the potential drop across $R_C$ via buffer amplifier 29 as shown in FIG. 1. The measured data is amplified and then delivered to signal processor and data transmission circuits 33.

Figure 5:
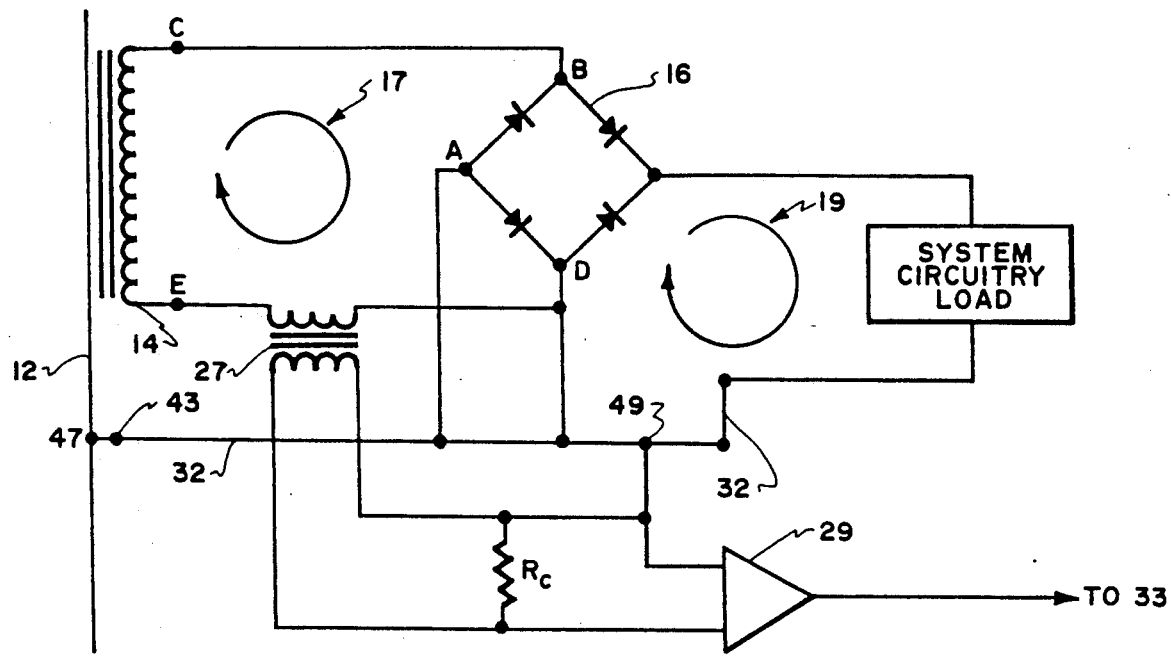
FIG. 5 is a diagram semi-schematic form illustrating an alternative current sensor configuration from that described in FIG. 1.

An alternative way to measure current as shown in FIG. 5 is to put a small current transformer 27 in series with the secondary of the main current transformer 14 at point 31 in FIG. 1. In this arrangement, the secondary of the small current transformer 27 is isolated from the rectifier 16 and is connected to the system return 32 at 49 and is terminated in a current sensing resistor $R_C$ followed by a buffer amplifier 29. There is no current at point 43. In FIG. 5, and likewise for the corresponding current loops in FIG. 1, since power line 12 is AC, current loop 17 is AC, and rectifier 16 makes current loop 19 DC.

Temperature sensors 22 and 28 are in contact with the transmission line 12 at 24 and with ambient air respectively. These temperature sensors are preferably current sources since the power line's strong electromagnetic fields tend to interfere with temperature sensors such as thermocouples whose output typically is in units of millivolts (mV) per degree of temperature change. Thus, the signal derived from the temperature sensors is a change in current per degree (Fahrenheit or Kelvin) which is amplified by temperature sensing amplifier circuits 26 and then delivered to the signal processing and data transmission circuits 33.

Signal processor and data transmission circuits 33 include electronic signal processing systems for both analog and for digital data. On the analog side, this signal processing circuitry includes an amplifier, an analog to digital converter and multiplexing circuits to process the measure sample inputs from line current sensing circuit 20, line voltage sensing circuit 30, phase angle sensing circuit 39 and temperature sensing circuits 26.

Typically true RMS voltage and true RMS current analog data for metering or load management purposes are digitized and then transmitted over the data link to ground; whereas, the real time 60 Hertz AC analog voltage and current waveforms for purposes of system protection or protective relaying or waveform analysis are typically not digitized, but rather are transmitted over a linear fiber optic data link having a linear transmitter and a linear receiver, or a linear radio frequency data link, or a linear optical-through-air data link thus avoiding the requirement of digitizing the data up on the high voltage power line.

Typically, a measure sample, for example, the true RMS voltage value, requires roughly 25 microseconds (μs) to convert from analog form to digital form. Typically, the digital measure sample can have 8, 10, or 12 bits. Typically, the digital measure sample is latched, and then loaded in parallel into a shift register which shifts the multi-bit measure sample serially to the digital transmitter. The digital transmitter may require, given today's state of the art, roughly 8 to 16 microseconds to transmit a single 10 bit measure sample. Also, there is typically an 8 to 16 microsecond orientation interval between the transmission of the last measure sample and the transmission of the next measure sample. Thus, in this example of a digital data link transmitting a single measure sample, a new measure sample is transmitted every 16 to 32 microseconds. Thus, the data transmission cycle period is 16 to 32 microseconds.

Measure samples of other parameters, such as true RMS current, can be added. Each additional measure sample, in our example, would typically add roughly 16 to 32 microseconds to the data transmission cycle period.

Digital and analog transmitting devices use radio transmissions over antenna 36, a fiber optic link 34 or optical-through-air transmissions 37.

Preferably fiber optic cable data link 34 contains fiber optic cable assembly components such as optical fibers, dielectric strength members and intermediate and outer jackets providing dielectric insulation, waterproofing and ultraviolet radiation resistance. Optionally, but preferably, the fiber optic link will also contain the large resistance link of the voltage divider of the line voltage sensing circuit used for measuring voltages as will be described in greater detail hereinafter.

Line voltage sensing circuit 30 is illustrated in FIG. 2 and is comprised of a small resistance $R_s$ connected directly to measuring station circuitry return line 32 in contact with transmission line 12 at 47 (FIG. 1). Small resistance $R_s$ in series with large resistance $R_L$ forms a voltage divider for measuring voltage on transmission line 12. Transmission line 12 is connected to the measuring station circuitry return 32 at line connection 47. $R_s$ is connected to system return 32 at point 45. Amplifier 44 is connected across $R_s$ at points 45 and 42 and provides an accurate buffered voltage output at 46 to signal processor and data transmission circuits 33. Preferably large resistance $R_L$ is a high resistance element incorporated into a fiber optic cable assembly 34 in FIG. 1 and 48 in FIG. 2 thus providing an advantageous low cost unibody mechanical construction which is connected to earth ground at 50.

Large resistance $R_L$ can be formed of homogeneous materials such as polymeric or ceramic materials containing a sufficient concentration of electrically conductive material to allow a small current to flow through the voltage gradient from the power line 12 to the earth ground 50, or by a discrete resistor assembly constructed of a plurality of discrete resistors having high precision tolerance and low temperature coefficient of resistance (TCR) Megohm resistances in series whose typically axial leads are connected end to end. The resistive material forming $R_L$ in cable 48 runs along the length of this cable between the monitoring system measuring station and a ground receiving and data processing station which may be located down on the ground, or up in the power transmission line tower. Large resistor $R_L$ will be encased in a high voltage insulating dielectric waterproof jacket with typically disc shaped sheds formed over the outer jacket to increase the creepage (high voltage discharge or arc-over) distance, thus forming a cable assembly suitable for exposure to weather, protection from corona damage and for outdoor use at elevated voltages.

The magnitude of the total resistance of the voltage divider formed by $R_s$ and $R_L$ is determined to allow a controlled small current flow of about 0.1 milleamperes (mA) to flow through the voltage divider. Voltage on transmission line 12 is then sensed and measured by first establishing a precise resistance ratio of $R_L$ to $R_s$, and then by measuring via line voltage sensing circuit 30 the voltage drop $V_1$ across $R_s$. The $V_1$ data is sent to signal processor and data transmission circuit 33 via connection 46 in FIG. 2. To calculate the unknown line voltage $V_x$, according to the voltage divider principle and Ohm's Law, the measured $V_1$ value is multiplied times the known quantity $(R_L+R_s)/R_s$. Typically that calculation is done at the ground receiving and data processing station 38 or at other equipment further downstream. Thus, according to the voltage divider principle and Ohm's Law, the ratio of the voltage $V_1$ sensed at 42 to the line voltage $V_x$ is the same as the ratio of the quantity $(R_s)$ to the quantity $(R_L+R_s)$.

Small resistance $R_s$ should be small enough to be a high precision tolerance and low TCR resistor component of the line voltage sensing circuit 30 enclosed in the monitoring system measuring station 10 mounted on transmission line 12, but sufficiently large to cause a measurable potential drop at 42.

Large resistance $R_L$ should be sufficiently large to provide a small controlled current of about 0.1 mA flowing through the divider, thereby preventing any excessive dissipation of heat within the resistive link and minimizing any potential electric shock hazard to service personnel.

The system installation is illustrated in FIG. 3. All the system circuitry within the housing pod 10 indicated by phantom lines in FIG. 1 will be housed within a smoothly contoured spherical or semi-spherical or box-shaped housing or pod 52 mounted or clamped on transmission line 12 with a device known as a "hot-stick" used by power companies. This method allows the system to be installed on power transmission lines without interruption of the flow of power. Large resistor $R_L$ of the voltage divider is contained within a cable assembly 54 connected from housing 52 to power line tower 56 at 58. Cable 54 typically has sheds 60 which are used to make creepage distance along the cable greater than the actual cable length. Transmission line 12 is connected to tower 56 by insulator 62 and is interconnected to a continuing transmission line on the other side of the tower by connecting link 64. Preferably the data communications link from the monitoring system measuring station is a fiber optic cable data link rather than a radio or optical-through-air data link. The radio type of data transmission is typically used where the transmission line monitoring system is located a long distance from the ground receiving and data processing station. The ground based receiving and data processing station 38 (FIG. 1) requires ground electrical power to be available; and, is co-located with downstream revenue metering, protection, or load management/networking equipment using the measured data, or, is co-located with downstream telemetry equipment which in turn transmits the measured data on to the metering, protection, or load management/networking equipment. Where there is nearby ground electric power available, the ground receiving and data processing station 38 (FIG. 1) can be in communication with the monitoring system by a fiber optic cable. In this preferred embodiment the fiber optic cable and the long linear filamentary shaped body of the $R_L$ resistance will be combined into a single cable assembly 54 serving as both a data link and as a voltage sensor resistive link.

A preferred arrangement for the construction of the cable assembly 54 is illustrated in FIG. 4. Typically, the dielectric strength member 70 is positioned at the center of the cross sectional area of the cable and is used to reinforce the cable and to carry the tensile and any torsional loads. Mastic material 65 forms a matrix between dielectric strength member 70 and the dielectric shield intermediate jacket 66 within which mastic matrix the desired number of optical fibers (three are shown: 72, 74 and 76) and the voltage sensing circuit voltage divider large resistance are encapsulated (if the resistive link is not separate from the fiber optic cable assembly). Environmental resistive outerjacket 68 encloses the dielectric shield intermediate jacket 66. In the cross sectional FIG. 4 view of cable assembly 54 the resistive link 78 is shown as a single continuous linear filamentary form.

Optical fibers 72, 74 and 76 in FIG. 4 can be considered as optical fiber paths OF1, OF2, and OF3 in FIG. 1. OF1 and OF2, respectively, represent the optical fiber data paths for the real time voltage (OF1) and real time current (OF2) analog waveforms which data are linearly modulated and transmitted in linear form through the linear data link. OF3 represents the optical fiber data path for the line true RMS voltage, line true RMS current, line phase angle, line and ambient temperature data digitally modulated and serially transmitted in digital form through the digital data link OF3.

Typically the optical fibers 72, 74, and 76 are helically or spirally wrapped around the dielectric central strength member 70 with a pitch of about one turn per linear foot along the entire length to avoid any tensile loading on the optical fibers.

The resistive link 78 may run straight down a groove or through a hole or be encapsulated within either mastic matrix 65 or central dielectric strength member 70 or intermediate jacket 66 of the cable assembly 54. Alternatively, the resistive link may wrap helically or spirally around the central strength member 70 or the mastic matrix 65 along with and having the same pitch as the optical fibers in order to avoid any tensile loading on the optical fibers or on the resistive link. Any resistive link inductive effects due to this large pitch typically are acceptably small; however, if it is desired to cancel out any inductive effects, then the resistive link form 78 could alternately consist of two separate identical resistive link filaments wrapped in a counter-helical fashion so that the induction of one is cancelled by the equal magnitude induction in the opposite direction from the other resistive link filament.

Optical fibers 72, 74 and 76 are preferably glass fibers of pure silicate cladded with a suitable reflective and refractive material to a diameter about twice that of the glass fiber itself and also having a protective coating around the cladding. For the purposes of favorable endurance to long term mechanical stresses and dynamic loading it is preferred that the optical fibers are helically wrapped around a central dielectric strength member 70. As stated previously a pitch of about one turn per linear foot of the central strengthening member 70 would be suitable. Optical fibers 72, 74 and 76 will be embedded within the visco-elastic mastic material 65 which also surrounds resistive link filament 78 and strengthening member 70 and bonds to intermediate jacket 66.

Since this system is subject to a high voltage environment, dielectric shield intermediate jacket 66 is needed to electrically insulate the core to prevent any current discharges across the cable radially from any radial voltage gradients between the core and surrounding air. Since outer jacket 68 is exposed to outdoor ambient air and weather it is optimized to be waterproof and resistant to oxidation and degradation from ultraviolet exposure; thus, for example, heat shrinkable polymers or co-polymers of silicon rubber or polyethylene would be most desirable. The cable assembly 54 components shown in FIG. 4 which are contained within the dielectric shield intermediate jacket 66 are referred to collectively as the core of the cable assembly.

Such compositions are particularly useful in terms of producibility in the manufacturing process of extruding sheds 60 (FIG. 3) over the outer jacket 68 and then forming a bond between the sheds and the outer jacket by heat shrinking both the sheds and the outer jacket. Particularly in applications involving the higher transmission voltages, such sheds beneficially increase the creepage distance and help prevent corona discharge.

Resistive link filament 78 may be a co-polymer or polymer dielectric plastic matrix made electrically conductive by the presence of electrically conductive material, such as carbon or other conductive material which is evenly dispersed throughout the resistive link material. The conductive material could alternately be distributed within mastic matrix 65 allowing the mastic matrix to serve as the resistive link instead of a separate filament 78. Further, since the mastic core 65 is linear in geometry (i.e. has no wraps or turns etc.) there will be minimum induction.

Alternately, the resistive link can be made of predominantly ceramic material such as silicon carbide (SiC) in the form of continuous filaments of yarn composed of many individual fibers. In the fabrication of the SiC yarn, silicon reacts with fibers of carbon to form SiC. The electrical conductivity of the SiC is due primarily to the presence of residual unreacted carbon at the center core of the fibers.

The temperature coefficient of resistance (TCR) for a ceramic resistive link, such as SiC, is roughly the same as for the polymeric plastic type of resistive link. Typically, a one degree Centigrade change in temperature causes roughly a 0.2 to 1.8 percent change in the resistance of the polymeric plastic or of the ceramic types of resistive link. Such an unfavorably large change in resistance would proportionally change the voltage ratio of $R_L$ to $R_S$ and thus would proportionally degrade the accuracy of the voltage measurements. One way to avoid such accuracy loss is to correct or compensate for the change in resistive link resistance as a function of ambient temperature by having the ambient temperature sensor 28 send its data to the signal processor 33 to correct the measured voltage for changes in the resistance of the $R_L$ resistive link caused by changes in ambient temperature. In fact, the ambient temperature sensor is small enough, roughly 0.002 cubic inches, to be encased within the cable assembly outer jacket 68 where it is adjacent to the resistive link 78 and thus, is exposed to the same temperature as the resistive link.

Thus, in general, for a high degree of voltage measurement accuracy and to minimize or eliminate the need for calibration, correction or compensation for changes in the resistance of the voltage divider as a function of changes in ambient temperature, the resistive link should have a very high precision resistance tolerance and a very low temperature coefficient of resistance. One preferred means of having a resistive link with both very high tolerance and very low TCR is to form the resistive link from a plurality of discrete resistors which can be assembled into a long string and encapsulated within the cable assembly running from the measuring station on the power line down to the ground. The discrete resistor elements would be chosen on the basis of having a very low TCR of less than 100 parts per million per degree Centigrade (ppm/°C.) and preferably in the range of 4–10 ppm/°C.; and also on the basis of having a high precision tolerance of less than one percent (%) and preferably 0.3% or even in the range of 0.10% down to 0.01% accuracy.

The leads of the discrete resistors which are typically axial and are about ½ inch long can, for example, first be overlapped about ¼ inch, then as required the leads can be tied together rigidly with roughly 10 or so tightly wrapped loops of thin wire to form a firm compressive mechanical connection, and finally the leads can be soldered together to form a conductive electrical connection. Thus, for example, if 100 individual discrete resistors are connected in series into a single assembly, the total resistance of the assembly equals the sum of the individual resistances of the discrete resistors; and if each individual resistor has a 0.1% tolerance, the tolerance of the assembly is also 0.1%.

After completion of the resistive link and encapsulation within cable 54, the actual resistance of the resistive link can, as required, be calibrated by using an ampere meter to measure the current through the resistive link of the voltage sensor with the measuring station attached to a calibration test facility power line voltage of precisely known magnitude and high stability. Further, several measurements of the large resistance $R_L$ made at several different temperatures can establish or verify the variation of the resistance as a function of temperature.

Since the TCR function, the dependent variable resistance as a function of the independent variable temperature, is known, the TCR is used to correct the measured voltage data for changes in temperature. Typically, the slope of the TCR above and below 25° C. is parabolic. Thus, if the TCR curve is a positive parabolic, the resistance also increases proportionally for temperatures above 25° C., and, the resistance also increases proportionally for temperatures below 25° C. Likewise, if the TCR curve is a negative parabolic, the resistance decreases proportionally for temperatures above or below 25° C. Whichever the case, it is preferred that the TCR parabolic positive or negative curve slope direction, either positive or negative, for $R_s$ be the same as for $R_L$.

This resistive link TCR function can be programmed into signal processor and data transmission circuit 33, or more typically, into the ground receiving and data processing station 38 utilizing, for example, programmable read only memory (PROM) hardware to process the measured voltage data to correct or compensate for the TCR of the resistive link.

However, such calibration and/or compensation generally is not necessary to meet the typical one percent (1.0%) accuracy requirements of most voltage measurement applications provided that high precision tolerance low TCR discrete resistors are used since such resistors are accurate to well within 1.0% without pre-field use calibration or data processing compensation during field use. For example, using discrete resistors having a high precision tolerance at 25° C. of 0.1% and a 20 ppm/°C. TCR, then a 50° C. change in temperature, which is about the range of annual variation in ambient temperature experienced by power lines, causes an error of only 0.001 or 0.1% due to the TCR. Adding the TCR 0.1% error to the 0.1% tolerance error gives a total error of 0.2% which is well within the typical application 1.0% limit, and even within the desired 0.3% limit for voltage accuracy in precision revenue metering applications.

The sensing and signal processor and data transmission circuits in the measuring station on the line and in the ground receiving and data processing station on the ground provide measurement of line temperature, ambient temperature, real time and true RMS line current and voltage, and line phase angle.

Processing circuits handle digital ambient and line temperature, line phase angle, and both real time waveform analog and true RMS digital line voltage and current data. The digital circuits use analog to digital conversion circuits, sample and hold or track and hold circuits, and multiplexing circuits familiar to those knowledgeable in this art. The digital voltage and current data are in true RMS units and are transmitted and received by digitally modulated radio or by digitally modulated optical or fiber optic transmitters and receivers for purposes of revenue metering, load/energy management, customer time of use, distribution automation, and networking.

The digitized true RMS voltage data is transmitted through the data link to the ground receiving and data processing station within which is a line voltage processor. The line voltage processor calculates the line voltage from the measured voltage drop across $R_s$ (FIG. 2, 42) and from the known voltage divider ratio of $(R_s+R_L)/R_s$ corrected as required for changes in $R_L$ and $R_s$ resistance as a function of changes in ambient temperature as measured by the ambient temperature sensor 28.

The digitized true RMS current data measured by line current sensing circuit 20 arrives at the ground receiving and data processing station within which is a line current processor. The line current processor calculates the line current from the true RMS current data measured by line current sensing circuit 20 and from the known transform ratio of the current transformer 14.

The digitized phase angle measured by 39 arrives at the ground receiving and data processing station within which is a line phase angle processor which further processes the phase angle data for revenue metering, system protection or load management purposes. Typically, the phase angle sensing circuit 39 measures the time period in seconds between respective points, such as the negative going zero-crossing of the voltage and current waveforms, and presents that data to the line phase angle processor which first converts the time period measured to units of phase angle phi ($\phi$) degrees, and then converts the phase angle in degrees to power factor by taking the cosine of the phase angle, since power factor equals the quantity (cos $\phi$).

Linear fiber optic transmitters and receivers are used to provide real time AC waveform analog voltage and current waveform data with only group delay between the measuring station on the power line and the ground receiving and data processing station for system protection and waveform analysis purposes.

Thus, typically for system protection purposes, the phase angle is calculated by the line phase angle processor within the protection processor of the ground receiving and data processing station on the ground receiving side of the linear fiber optic data link from the transmitted 60 Hz AC voltage and current waveforms. The analog voltage and current waveform data is used to calculate waveform absolute magnitude and phase angle over the last whole or fractional AC cycle. The protection processor line phase angle processor first measures the time period in seconds between respective points of the voltage and current waveforms, and then converts the measured time period into units of phase angle degrees, and finally takes the cosine of phase angle $\phi$ to calculate the power factor, since power factor equals the quantity (cos $\phi$). This system protection data processing protection processor receives the line analog real time voltage and current waveforms, and the digitized true RMS voltage and true RMS current and phase angle data, and thus has all the data needed for use by all the system protection algorithms and transfer functions to supply the specified output for a power company's downstream system protection devices. Thus, typically the protection processor is part of the ground based ground receiving and data processing station which, of course, is linked to the downstream protection equipment which may require the line voltage and current waveform data to be in analog or digital form. Thus, the real time analog waveform data after arrival on the ground ray remain in analog form or may be digitized by the ground based protection equipment. In other configurations, the waveform data may be digitized up in the monitoring station on the power line and then transmitted along with the other digital data or may be transmitted separate from the other digital data via data links dedicated for the protection data.

The line temperature and ambient temperature sensors provide an input to the temperature sensing circuit or amplifier which provides an analog output data path D3 in FIG. 1, to sampling and hold or track and hold, analog to digital and multiplexing circuits in the signal processor and data transmission circuits 33. The data transmission circuits provide a digital output through, for example, a fiber optic transmitter to a fiber optic receiver at the ground receiving and data processing station in order to provide the ambient temperature data to the line voltage processor to correct for changes in $R_L$ as a function of temperature as required, and for purposes of Dynamic Thermal Line Rating. The temperature sensing circuit 26 converts the analog signal input from the temperature sensors 22 and 28 to an analog output in volts for processing by the signal processor and data transmission circuit 33.

A fiber optic data link such as the cable assembly of FIG. 4 is preferred because it will enable two-way duplexing flow of data between the ground receiving and data processing station 38 and the signal processor and data transmission circuit 33. This will allow not only the flow of measure sample data from the measuring station up on the power line to the ground receiving station, but also the uplinking of diagnostic and calibration data through the cable from the ground based station. Other data links, such as radio and optical-through-air do not feasibly offer this two-way duplexing data flow. For example, mounting a radio receiving antenna within the measuring station housing alters its shape and presents issues of corona and background noise interference from the power line Optical-through-air transmitters and receivers are subject to the accumulation of films of contamination on the optical or lens surfaces and poor reception during atmospheric conditions of fog, dust, rain, sleet or snow and thus are not preferred.

The resistive link fiber optic cable assembly central dielectric strength member carries the tensile load, not the resistive link or optical fibers which are typically helically wrapped around the central strength member. There is little torsional twisting of the resistive link fiber optic cable assembly because of its construction and size, roughly one inch in diameter between the sheds with the shed diameter about four inches for a 230 KV power line phase conductor, and because it is free hanging from the monitor system measuring station housing up on the line down to the earth ground receiving station on the power line tower or some other ground location.

For a 230 KV power line, for example, the resistive link $R_L$ would typically have a total resistance of roughly two thousand (2,000) Megohms to permit a small but measureable current of about 0.1 mA to flow through the resistive link 78. In this case, the small resistance $R_s$ would typically have a resistance of roughly one hundred thousand ohms (100.K ohms). This will provide a voltage divider ratio of large resistance $R_L$ to small resistance $R_s$ of about twenty thousand to one (20,000:1).

For a 230 KV power line, for example, the resistive link filament of cable 54 typically can have a linear resistivity along its length of from roughly 2 to 8 Megohms per centimeter. Thus, for example, if the resistive link total resistance is 2,000 Megohms and its linear resistivity is 2 Megohms per cm., then its length would be about 1,000 cm. or 33 feet. The resistive link can be composed of polymeric plastic such as a fluoropolymer or of a ceramic material such as silicon carbide fibers in a filamentary shape, or it may be composed of an assembly of discrete resistors connected together in series in a long linear assembly. All three of those resistive link materials offer the necessarily wide range of linear resistivities necessary to measure voltage across the spectrum of voltages encountered in the power company lines.

As the power line voltage increases, proportionately higher resistive link linear resistivities are needed to keep the current in the 0.1 mA range for a given (fixed) resistive link length. In the case of polymeric plastics, to increase the linear resistivity, the concentration of the conductive carbon or other solute within the fluorocarbon or other plastic solvent matrix is decreased. For ceramic fibers such as SiC, to increase the linear resistivity, proportionately fewer fibers are used in the resistive link filament. For the case of the discrete resistor assembly, to increase the linear resistivity, higher resistance discrete resistors are used.

Whether fiber optic elements are included in cable 54, the resistive link is a separate bridge to ground independent of the data link. The resistive link must be jacketed to provide mechanical and environmental protection. Jacketing materials such as polyurethane, tetrafluoroethylene, polytetrafluoroethylene or co-polymers of silicon rubber and polyethylene and ethyl vinyl acetate would be suitable, for example.

Thus there has been disclosed a unique electric power transmission line monitoring system which will monitor line voltage, line current, line phase angle, ambient and line temperature and provide outputs to data processor circuits to provide complete monitoring of all functions of transmission lines. The system is compact and easy to install without the need for a line outage and without interfering with line operation.

This invention is not to be limited by the embodiment shown in the drawings and described in the description which is given by way of example and not of limitation, but only in accordance with the scope of the appended claims.

What is claimed is:

1. A power transmission line monitoring system comprising;
   current sampling means for sampling current on a transmission line;
   rectifying means for rectifying the output of said current sampling means;
   power supply means connected to the output of said rectifying means for producing power;

line current sensing means connected to said rectifying means for sensing line current;
line temperature sensing means for sensing the temperature of said transmission line;
line voltage sensing means connected to said transmission line, said line voltage sensing means including a voltage divider comprised of a small resistance connected to said transmission line in series with a very large resistance connected to earth ground;
signal processing means receiving and processing the outputs of said line current sensing means, said line temperature sensing means and said line voltage sensing means; said signal processing means including data transmission means for transmitting current, temperature and voltage data to a receiving and data processing station located remotely from said power transmission line for recording and analysis;
said data transmitting means comprising a cable that includes said very large resistance of said voltage divider; and
a common system return connecting said line current sensing means, said line temperature sensing means, said line voltage sensing means, said power supply and said signal processing means to said transmission line whereby system circuits are isolated from earth ground by using the power transmission line as a reference.

2. The power line monitoring system according to claim 1 in which said line current sensing means includes a precision resistor in the system return connected to the rectifier.

3. The power line monitoring system according to claim 1 in which said line current sensing means includes a small current transformer in secondary of the small current transformer isolated and terminated in a current sensing resistor followed by a buffer amplifier.

4. The power line monitoring system according to claim 1 in which said current sampling means comprises a current transformer enclosing the power transmission line phase conductor being monitored.

5. The power line monitoring system according to claim 1 in which said line temperature sensing means comprises a temperature sensor in contact with said transmission line phase conductor; and temperature sensing circuit means receiving and processing the output of said temperature sensor.

6. The power line monitoring system according to claim 5 including; an ambient temperature sensor for sensing ambient temperature; said temperature sensing circuit means receiving the output of said ambient temperature sensor whereby corrections in voltage measurements due to changes in the resistance of the voltage divider large and small resistances due to changes in ambient temperature may be generated as required in said signal processing means.

7. The power line monitoring system according to claim 1 in which said voltage divider large resistance comprises an elongated resistive link within a cable connected from said line voltage sensing means to earth ground.

8. The power line monitoring system according to claim 7 in which said signal processing means includes: analog processing circuitry means; analog to digital conversion means for converting some received analog signals from analog to digital; multiplexing means for multiplexing a plurality of signals received from a plurality of sensing circuits; and data transmission circuit means for transmitting both analog and digital data to said ground receiving station.

9. The power line monitoring system according to claim 7 in which said resistive link cable is comprised of a continuous resistive link filament means.

10. The power line monitoring system according to claim 9 in which said continuous resistive link filament means is an electrically conductive plastic consisting of a polymer or co-polymer.

11. The power line monitoring system according to claim 9 in which said continuous resistive filament means is an electrically conductive ceramic material consisting of a ceramic material with an excess of electrically conductive material.

12. The power line monitoring system according to claim 9 in which said resistive link means is a plurality of series-connected discrete high precision tolerance low temperature coefficient of resistance resistors.

13. The power line monitoring system according to claim 7 in which said data transmission means includes a data transmitting fiber optic link means in a cable connecting said signal processing means to a ground receiving and data processing station.

14. The power line monitoring system according to claim 13 in which said resistive link means is connected to a nearby transmission line tower to provide said earth ground.

15. The power line monitoring system according to claim 13 in which said fiber optic data link means is incorporated in said cable with said resistive link.

16. The power line monitoring system according to claim 15 in which said cable having said resistive link means and fiber optic data link means comprises: a core having a central strengthening member; said resistive link means being encapsulated in said core;
said resistive link being selected from the group consisting of, an electrical conductive plastic, an electrically conductive ceramic, a plurality of discrete resistors in an assembly and an electrically resistive filament;
said fiber optic data link means being a plurality of optical fiber elements encapsulated in said core; and dielectric insulating and weatherproofing and ultraviolet radiation resistant jacketing means enclosing said core with said resistive link means and said fiber optic link means.

17. The power line monitoring system according to claim 16 in which said plurality of fiber optic link means comprises one or more fiber optic optical fiber elements encapsulated in said core whereby two-way communication is provided between a ground receiving station and said power line monitoring system measuring system.

18. The power line monitoring system according to claim 16 in which said resistive link means encapsulated in said core means is one filamentary body helically wound around said central dielectric strengthening member to minimize tensile and other mechanical loading.

19. The power line monitoring system according to claim 16 in which said resistive link means encapsulated in said core means is two twin filamentary bodies counterhelically wound around a central dielectric strengthening member to minimize tensile and other mechanical loading and to cancel any inductive effects due to the helical wraps.

20. The power line monitoring system according to claim 16 in which said resistive link means encapsulated in said core means is one or more straight filaments running parallel to the central dielectric strengthening member.

21. A power transmission line monitoring system comprising:

current sampling means for sampling current on a transmission line;

rectifying means for rectifying the output of said current sampling means;

power supply means connected to the output of said rectifying means for producing power;

line current sensing means connected to said rectifying means for sensing line current via buffer circuit means in real time waveform units; transmitting means transmitting said real time waveform units in analog or digital form, and in true RMS current units from the output of an AC to true RMS converter circuit means in digital form;

line temperature sensing means for sensing the temperature of said transmission line phase conductor;

ambient temperature sensing means for sensing the temperature of the ambient air;

line voltage sensing means connected to said transmission line, said line voltage sensing means including a voltage divider comprised of one or more small resistances and a very large resistance connected in series between said line and earth ground; said voltage data being sensed by said buffer circuit in real time waveform units; said transmitting means transmitting said real time waveform units in analog or digital form, and in true RMS voltage units from the output of said AC to true RMS converter circuit means in digital form;

said very large resistance of said voltage divider being incorporated in said transmitting means;

line phase angle sensing means connected to the line voltage sensing means and to the line current sensing means;

signal processing means receiving and processing the outputs of said line current sensing means, said line and ambient temperature sensing means said line voltage sensing means and said line phase angle sensing means; said signal processing means including data transmission means for transmitting current, temperature, voltage and phase angle digital or analog data to a remote ground location which receives, processes, records, analyses, and forwards the data; and a common measuring station circuitry system return connecting said line current sensing means, said line and ambient temperature sensing means, said line voltage sensing means, said phase angle sensing means, said power supply and said signal processing means all to said transmission line phase conductor whereby system circuit are isolated from earth ground using the power transmission line phase conductor as a reference.

* * * * *